United States Patent
Fiedler et al.

(10) Patent No.: US 7,550,095 B2
(45) Date of Patent: Jun. 23, 2009

(54) HIGHLY EFFICIENT LUMINOUS SUBSTANCE

(75) Inventors: Tim Fiedler, München (DE); Frank Jermann, München (DE)

(73) Assignee: Patent-Treuhand-Gesellschaft für elektrische Glühlampen mbH, Munich (DE)

(*) Notice: Subject to any disclaimer, the term of this patent is extended or adjusted under 35 U.S.C. 154(b) by 232 days.

(21) Appl. No.: 10/573,398

(22) PCT Filed: Sep. 24, 2004

(86) PCT No.: PCT/DE2004/002137

§ 371 (c)(1),
(2), (4) Date: Mar. 23, 2006

(87) PCT Pub. No.: WO2005/030905

PCT Pub. Date: Apr. 7, 2005

(65) Prior Publication Data

US 2007/0080326 A1    Apr. 12, 2007

(30) Foreign Application Priority Data

Sep. 24, 2003   (DE) ................................ 103 44 330

(51) Int. Cl.
C09K 11/79 (2006.01)
H01L 33/00 (2006.01)

(52) U.S. Cl. .................... 252/301.4 F; 252/301.6 F; 257/98; 313/503

(58) Field of Classification Search ............ 252/301.4 F, 252/301.6 F; 313/503; 257/98
See application file for complete search history.

(56) References Cited

U.S. PATENT DOCUMENTS

| 4,897,319 | A | 1/1990 | Sun et al. |
| 6,717,353 | B1 * | 4/2004 | Mueller et al. ............. 313/501 |
| 7,061,024 | B2 * | 6/2006 | Schmidt et al. .............. 257/98 |
| 2005/0156496 | A1 * | 7/2005 | Takashima et al. .......... 313/237 |
| 2006/0076883 | A1 * | 4/2006 | Himaki et al. ............. 313/503 |

FOREIGN PATENT DOCUMENTS

| EP | 1 264 873 A | 12/2000 |
| EP | 1 104 799 A | 6/2001 |
| EP | 1 143 618 A | 4/2004 |
| EP | 1 449 264 B1 | 8/2006 |
| WO | WO 2004/030109 A | 4/2004 |
| WO | WO 2004/039915 | * 5/2004 |

OTHER PUBLICATIONS

W.H. Zu, et al., "Phase relationships in the Sr-Si-O-N system", Journal of Materials Science Letters vol. 13, pp. 560-562, 1994.
J. van Krevel, "On new rare-earth doped M-Si-Al-O-N materials", Chapter 6, pp. 73-87, 2000.

* cited by examiner

*Primary Examiner*—C. Melissa Koslow
(74) *Attorney, Agent, or Firm*—Cohen Pontani Lieberman & Pavane LLP

(57) ABSTRACT

Phosphor from the class of the oxynitridosilicates, having a cation M which is doped with divalent europium, and having the empirical formula $M_{(1-c)}Si_2O_2N_2:D_c$, where M=Sr or $M=Sr_{(1-x-y)}Ba_yCa_x$ with $x+y<0.5$, the oxynitridosilicate completely or predominantly comprising the high-temperature-stable modification HT.

26 Claims, 9 Drawing Sheets

HIGHLY EFFICIENT LUMINOUS SUBSTANCE

RELATED APPLICATIONS

This is a U.S. national stage of application No. PCT/DE2004/002136, filed on 24 Sep. 2004.

The present application is related to the following applications: U.S. Ser. Nos. 10/572,841, 10/574,021 and 10/574,026.

FIELD OF THE INVENTION

The invention is based on a high-efficiency phosphor from a class of nitridosilicates and, in particular, phosphors from the class of the oxynitridosilicates of Sr.

BACKGROUND OF THE INVENTION

Phosphors of the oxynitridosilicate type are known per se under the shortened formula MSiON; cf. for example "On new rare-earth doped M-Si—Al—O—N materials", J. van Krevel, TU Eindhoven 2000, ISBN 90-386-2711-4, Chapter 6. There, they are doped with Tb. Emission is achieved under excitation by 365 nm or 254 nm.

A new type of phosphor is known from EP patent 1 449 264, which corresponds to U.S. Ser. No. 10/496,560. It consists of Eu or Eu, Mn-coactivated oxynitridosilicate of formula $MSi_2O_2N_2$ (M=Ca, Sr, Ba)

The basic structure of the host lattice is known from "Phase Relationships in the Sr—Si—O—N system", W. H. Zhu et al., J. Mat. Sci. Lett. 13 (1994), pp. 560-562, where it is discussed in conjunction with ceramic materials. In this reference, it was established that this structure occurs in two modifications, namely a low-temperature phase X1 and a high-temperature phase X2. The low-temperature phase, referred to below as LT for short, is produced predominantly at approximately 1300° C., whereas the high-temperature phase, referred to below as HT for short, is increasingly produced at higher temperatures up to approximately 1600° C. However, the two phases are fundamentally difficult to separate, since they have the same basic structure but different lattice constants. The exact stoichiometry of the two phases may deviate from the formula $MSi_2O_2N_2$.

SUMMARY OF THE INVENTION

It is an object of the present invention to provide a phosphor from a class of nitridosilicates with the highest possible efficiency. A further object is to provide a light source using this phosphor and a process for producing this efficient phosphor.

These and other objects are attained in accordance with one aspect of the present invention directed to a high-efficiency phosphor from the class of the oxynitridosilicates having a cation M and the empirical formula $M_{(1-c)}Si_2O_2N_2:D_c$, where M contains Sr as a constituent and where D is a divalent doping comprising europium, wherein Sr alone or $Sr_{(1-x-y)}Ba_yCa_x$ with x+y<0.5 is used for M, the oxynitridosilicate completely or predominantly comprising the high-temperature-stable modification HT.

Another aspect of the present invention is directed to a light source having a primary radiation source which emits radiation in the short-wave region of the optical spectral region in the wavelength range from 50 to 480 nm, this radiation being completely or partially converted into secondary radiation of a longer wavelength, in particular in the visible spectral region, by means of at least a first phosphor as described above.

Yet another aspect of the present invention is directed to a process for producing the high-efficiency phosphor described above, comprising the steps of: a) providing the starting products $SiO_2$, $Si_3N_4$, as well as a Eu precursor, remainder $MCO_3$, as well as a Eu precursor, in a substantially stoichiometric ratio and mixing the products; and b) annealing the mixture at approximately 1300 to 1600° C., preferably 1450 to 1580° C.

Hitherto, there has been no high-efficiency, green-emitting phosphor which is at the same time insensitive to external influences and, moreover, can be excited successfully by blue-emitting or UV-emitting LEDs.

The phosphor $MSi_2O_2N_2$:Eu (M=Ca, Sr, Ba) which is known from EP patent application 02 021 117.8, in the case of the Sr-dominated embodiment with $M=Sr_{(1-x-y)}Ba_yCa_x$ with $0 \leq x+y<0.5$, referred to below as Sr Sion, is difficult to control. Although some test conditions give excellent results, there has hitherto been no guiding principle as to how to obtain desired results in a reliable way. An additional factor is a certain tendency of the efficiency of the phosphor to be reduced and the color locus to vary excessively under high thermal loads. The following are particularly preferred: y=0 with $0 \leq x \leq 0.3$ and x=0 with $0 \leq y \leq 0.3$.

Surprisingly, it has now been found that the two phases fundamentally differ in terms of their suitability for use as a phosphor. Whereas the LT phase is of only limited use as a Eu-doped phosphor and tends to emit orange-red light, the HT phase has an excellent suitability for use as a phosphor which emits green light. There is often a mixture of the two modifications which manifests both forms of emission over a broad band. It is therefore desirable for the HT phase to be produced in as pure a form as possible, in a proportion of at least 50%, preferably at least 70%, particularly preferably at least 85%.

This requires an annealing process which is carried out at at least 1300° C. but no more than 1600° C. A temperature range from approximately 1450 to 1580° C. is preferred, since LT phase is formed to an increasing extent at lower temperatures and the phosphor becomes increasingly difficult to process at higher temperatures; above approximately 1600° C. it forms a hard-sintered ceramic or melt. The optimum temperature range depends on the precise composition and the properties of the starting materials.

A batch of the starting products which is substantially stoichiometric using the base components $SiO_2$, $SrCO_3$ and $Si_3N_4$ is particularly important for producing an efficient phosphor of the Sr Sion type. Sr acts as a representative example of M in this context. The deviation should amount to no more than in particular 10%, preferably 5%, from the ideal stoichiometric batch, including any addition of a melting auxiliary, as is often customary. A maximum deviation of 1% is particularly preferred. In addition, there is a precursor for the europium fraction of the doping, realized, for example, as oxide $Eu_2O_3$. This discovery runs contrary to the previous procedure of adding the base component $SiO_2$ in a significantly substoichiometric proportion. This discovery is also particularly surprising on account of the fact that other Sions which are recommended for use as phosphors, such as Ba Sion in accordance with the teaching of EP patent application 02 021 117.8, should indeed be produced with a substoichiometric quantity of $SiO_2$.

Therefore, a corresponding batch for the Sr Sion $MSi_2O_2N_2$ uses 11 to 13% by weight of $SiO_2$, 27 to 29% by weight of $Si_3N_4$, remainder $SrCO_3$. Ba and Ca fractions in M are correspondingly added as carbonates. Europium is added, in accordance with the desired doping, for example as an oxide or fluoride, as a replacement for $SrCO_3$. The batch $MSi_2O_2N_2$ is also to be understood as encompassing any deviations from the exact stoichiometry, provided that they are compensated for with a view to charge retention.

It has proven particularly expedient for the starting components of the host lattice, in particular $Si_3N_4$, to have the highest possible purity. Therefore, $Si_3N_4$ which is synthesized from the liquid phase, for example starting from silicon tetrachloride, is particularly preferred. In particular the contamination with tungsten and cobalt has proven critical. In this case the impurity levels of each of these constituents should be as low as possible, in particular less than 100 ppm, in particular less than 50 ppm, with respect to these precursor substances. Furthermore, the highest possible reactivity is advantageous; this parameter can be quantified by the reactive surface area (BET), which should be at least 6 $m^2/g$, advantageously at least 8 $m^2/g$.

Also, the contamination with aluminum and calcium should be as far as possible below 100 ppm with respect to this precursor substance $Si_3N_4$.

In the event of a deviation from the above procedure with regard to a stoichiometric batch and temperature management, increasing levels of undesirable foreign phases, namely nitridosilicates $M_xSi_yN_z$, such as for example $M_2Si_5N_8$, are formed if the addition of $SiO_2$ is set at too low a level, so that an excess of nitrogen is produced. Although this compound per se is a useful phosphor, with regard to the synthesis of the Sr Sion, it is extremely disruptive just like other nitridosilicates, since these foreign phases absorb the green radiation of the Sr Sion and may convert it into the known red radiation provided by the nitridosilicates. Conversely, if too much $SiO_2$ is added, Sr silicates, such as for example $Sr_2SiO_4$, are formed, since an excess of oxygen is produced. Both foreign phases absorb the useful green emission or at least lead to lattice defects such as vacancies, which have a considerable adverse effect on the efficiency of the phosphor. The starting point used is the basic principle that the level of the foreign phases should be as far as possible below 15%, preferably even below 5%. In the XRD spectrum of the synthesized phosphor, this corresponds to the requirement that with the XRD diffraction angle 2 $\ominus$ in the range from 25 to 32°, the intensity of all the foreign phase peaks should be less than ⅓, preferably less than ¼, particularly preferably less than ⅕, of the intensity of the main peak characterizing the HT modification at approximately 31.8°. This applies in particular to the foreign phases of type $Sr_xSi_yN_z$, in particular $Sr_2Si_5N_8$.

With an optimized procedure, it is reliably possible to achieve a quantum efficiency of from 80 to well over 90%. By contrast, if the procedure is not specific, the efficiency will typically lie in the range from at most 50 to 60% quantum efficiency.

Therefore, according to the invention it is possible to produce a phosphor which represents an oxynitridosilicate of formula $MSi_2O_2N_2$ (M=Ca, Sr, Ba) which is activated with divalent Eu, if appropriate with the further addition of Mn as co-activator, with the HT phase forming the majority or all of the phosphor, i.e. more than 50% of the phosphor, preferably more than 85% of the phosphor. This HT modification is distinguished by the fact that it can be excited within a broad band, namely in a wide range from 50 to 480 nm, in particular 150 to 480 nm, particularly preferably from 250 to 470 nm, that it is extremely stable with respect to external influences, i.e. does not reveal any measurable degradation at 150° C. in air, and that it has an extremely good color locus stability under fluctuating conditions. Further plus points include its low absorption in the red, which is particularly advantageous in the case of phosphor mixtures. This phosphor is often also referred to below as Sr Sion:Eu. A majority of the HT modification can be recognized, inter alia, from the fact that the characterizing peak of the LT modification in the XRD spectrum at approximately 28.2° has an intensity of less than 1:1, preferably less than 1:2, compared to the peak with the highest intensity from the group of three reflections of the HT modification which lie in the XRD spectrum at 25 to 27°. The XRD spectra cited here in each case relate to excitation by the known Cu—$K_\alpha$ line.

With the same activator concentration, this phosphor reveals different emission characteristics than the LT variant of the same stoichiometry. The full width at half maximum of the HT variant is significantly lower in the case of the optimized HT variant than in the case of the simple mixture containing foreign phases and defects, and is in the range from 70 to 80 nm, whereas the simple mixture containing foreign phases and defects has a full width at half maximum of approximately 110 to 120 nm. The dominant wavelength is generally shorter, typically 10 to 20 nm shorter, in the case of the HT modification than in the case of a specimen containing significant levels of foreign phases. An additional factor is that the efficiency of the high-purity HT modification is typically at least 20% higher, and in some cases significantly higher still, than in the case of the LT-dominated mixture or the mixture with a high level of foreign phases.

One characterizing feature of a sufficiently low level of the NT modification and foreign phases is a full width at half maximum (FWHM) of the emission of less than 90 nm, since the lower the level of foreign phases, the lower the proportion of the specific orange-red emission from the modification which is rich in foreign phases, in particular the nitridosilicate foreign phases Sr—Si—N—Eu such as in particular Sr2Si5N8:Eu.

The abovementioned typical reflections in the XRD spectrum, which reveal the different crystal structure, are another important factor, in addition to the reduced full width at half maximum, in establishing the characterization.

The dominant peak in the XRD spectrum of the HT modification is the peak at approximately 31.7°. Other prominent peaks are the three peaks of approximately the same intensity between 25 and 27° (25.3 and 26.0 and 26.3°), with the peak with the lowest diffraction being the most intensive. A further intensive peak is 12.6°.

This phosphor emits predominantly green light with a dominant wavelength in the range from 555 to 565 nm.

It is also possible to add a small amount of the AlO group as a replacement for the SiN group in the molecule of the oxynitridosilicate of formula $MSi_2O_2N_2$, in particular in an amount of up to at most 30% of the SiN content.

Both phases of the Sr Sion:Eu can crystallize analogously to the two structurally different host lattice modifications and can each be produced using the SrSi2O2N2:Eu batch stoichiometry. Minor deviations from this stoichiometry are possible. The Eu-doped host lattices surprisingly both luminesce when excited in the blue or UV region, but in each case after host lattice modification with a different emission color. The LT modification reveals an orange emission, the HT modification a green emission at approximately $\lambda_{dom}$=560 nm with in principle a significantly higher efficiency. A desired property of the phosphor can be set accurately as a function of the dopant content and dopant material (Eu or Eu, Mn) and the relative proportions of the HT and LT modifications. In one embodiment, a proportion of Eu, in particular up to 30 mol %, is replaced by Mn.

One benefit of the HT phase is the fact that it can be excited with a good level of uniformity over a very wide spectral region with only minor variations in the quantum efficiency.

Moreover, within a wide temperature range the luminescence of the HT modification is only weakly dependent on the temperature. Therefore, the invention has for the first time discovered a green-emitting phosphor, preferably for LED applications, which makes do without special measures to stabilize it. This distinguishes it in particular from the phosphors which have previously been regarded as the most promising candidates for this purpose, namely thiogallate phosphors or chlorosilicates.

In general, this phosphor can be excited efficiently by a whole range of light sources: in particular by LED chips (for example of the InGaN type), which emit UV or blue light as primary radiation in the range from 300 to 480 nm; furthermore, by all types of lamps, in particular Hg low-pressure and high-pressure lamps, as well as UV and VUV radiators between approximately 50, preferably at least 150 nm, and 400 nm, for example excimer radiators. At 160 nm, the quantum efficiency is still approximately 50% of the maximum quantum efficiency.

This phosphor is especially suitable for applications in luminescence conversion LEDs suitable for full color and luminescence conversion LEDs with colors which can be set as desired based on an LED which primarily emits UV-blue.

The Sion compounds with M=(Sr, Ba), preferably without Ba or with up to 30% of Ba, represent efficient phosphors with a wide range of emission maxima. These maxima are generally at a shorter wavelength than in the case of pure Sr Sion, preferably between 520 and 565 nm. Moreover, the color space which can be achieved can be widened by adding small amounts (preferably up to 30 mol %) of Ca and/or zinc; this shifts the emission maxima toward the longer-wave region compared to pure Sr Sion, and by partially (up to 25 mol %) replacing Si with Ge and/or Sn.

A further embodiment is for M, in particular Sr, to be partially substituted by trivalent or monovalent ions, such as La3+ or Li+. It is preferable for these ions to form at most 20 mol % of the M.

The phosphor according to the invention can preferably be used for luminescence conversion LEDs to generate white light, albeit with blue primary radiation, in which case Sr Sion can be used as green component together with $SrS:Eu^{2+}$ as red component, but also with UV primary radiation, in which case white light is generated by means of known blue- and red-emitting phosphors and a green-emitting phosphor according to the invention. In one embodiment, the red emitting phosphors have a peak in a range from 580-670 nm. Candidates for the blue component here are known per se, by way of example, $BaMgAl_{10}O_{17}: Eu^{2+}$ (known as BAM) or $Ba_5SiO_4(Cl,Br)_6: Eu^{2+}$ or $CaLa_2S_4: Ce^{3+}$ or also $(Sr,Ba,Ca)_5(PO_4)_3Cl: Eu^{2+}$ (known as SCAP) are suitable. The phosphor according to the invention is suitable for use as the green component. A red phosphor can be used for the red emission; $((Y,La,Gd,Lu)_2O_3: Eu^{3+}$, or else $(Ca,Sr)_2Si_5N_8: Eu^{2+}$ are especially suitable.

DETAILED DESCRIPTION OF THE DRAWINGS

Figure 1:
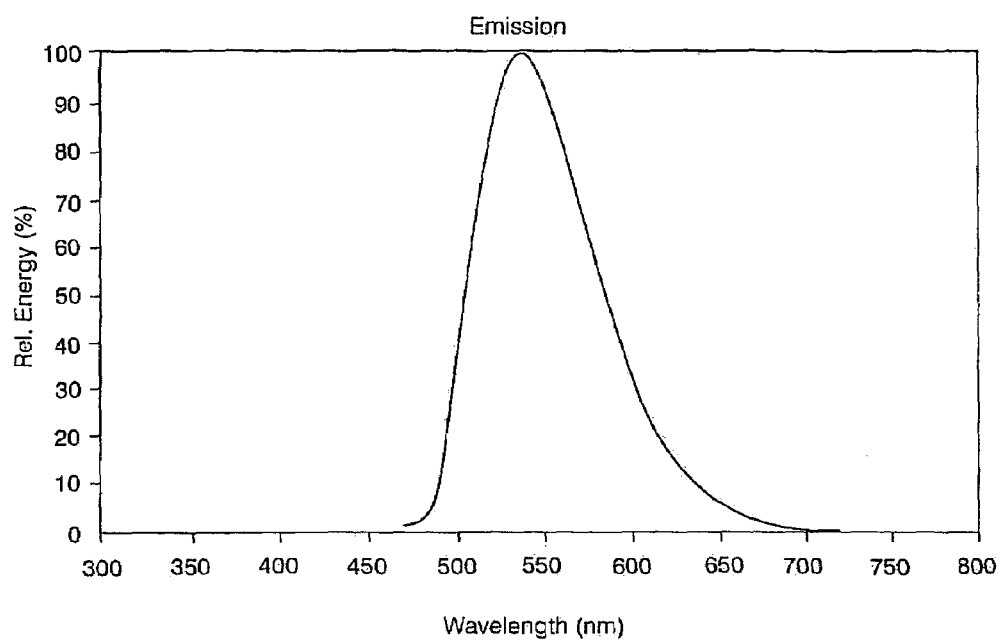
FIG. 1 shows an emission spectrum for a first oxynitridosilicate.

FIG. 1 shows a specific example for the phosphor according to the invention. This example relates to the emission of the phosphor $SrSi_2N_2O_2:5\% Eu^{2+}$) in the HT modification, in which the Eu fraction forms 5 mol % of the lattice sites occupied by Sr. The emission maximum is at 540 nm, the mean wavelength (dominant wavelength) at 560 nm. The color locus is x=0.357; y=0.605. The excitation took place at 460 nm, and the FWHM is 76 nm. In one embodiment, the Eu fraction makes up between 0.1 and 20 mol % of M.

Production involves first of all mixing the starting substances $SrCO_3$, $Si_3N_4$ and $SiO_2$ in with one another in an exact stoichiometry and the mixture then being annealed under reducing conditions under $N_2$ and $H_2$ for 8 hours at 1500° C. in the furnace. The result is a stoichiometric batch containing 12.05% by weight of $SiO_2$, 28.10% by weight of $Si_3N_4$ and 56.27% by weight of $SrCO_3$, plus 3.53% by weight of $Eu_2O_3$. Therefore, 5 mol % of Eu as activator replaces the cation Sr.

Figure 2:
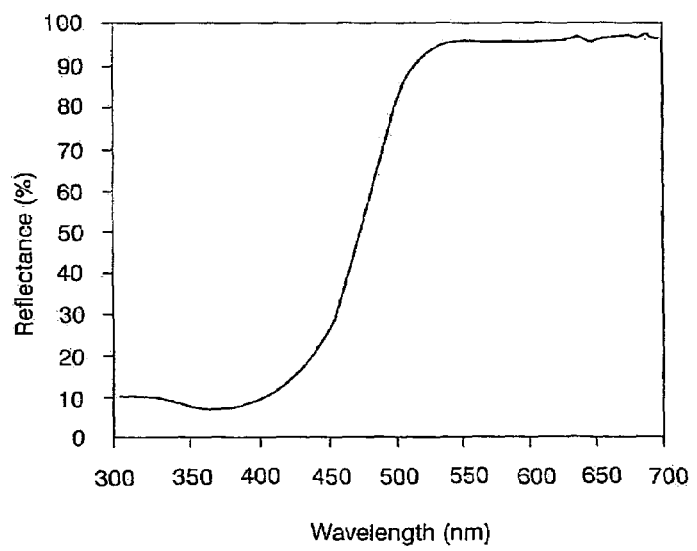
FIG. 2 shows the reflection spectrum of this oxynitridosilicate.

FIG. 2 shows the diffuse reflection spectrum for this phosphor. It reveals a pronounced minimum in the range below 440 nm and sufficient absorption at 470 nm, which therefore demonstrates the good excitability in this range.

Figure 8:
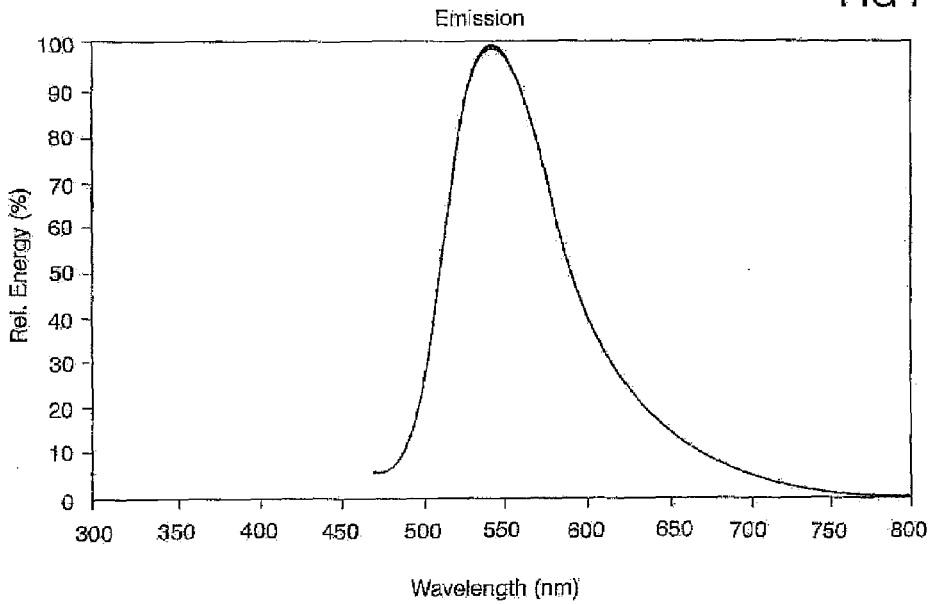
FIGS. 8-10 show an emission spectrum for further oxynitridosilicates.

FIG. 8 shows an example for a highly efficient green-emitting phosphor. This relates to the emission of the phosphor $SrSi_2N_2O_2:(10\% Eu^{2+})$ in HT modification, in which the Eu fraction makes up 10 mol % of the lattice sites occupied by Sr. The emission maximum is at 545 nm, the mean dominant wavelength is at 564 nm (λdom). The color locus is x=0.393; y=0.577. The excitation was at 460 nm. The FWHM is 84 nm.

Figure 3:
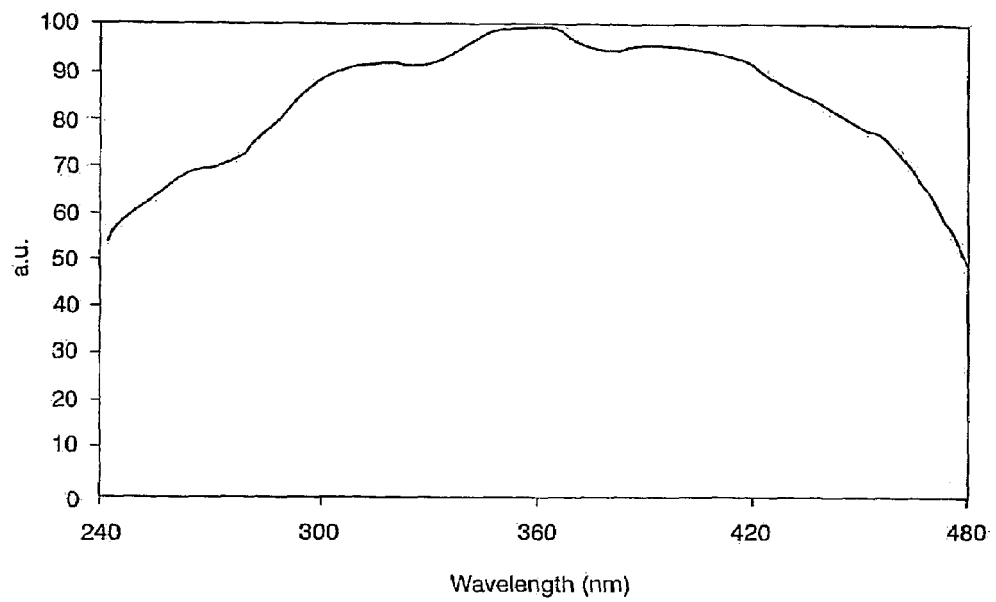
FIG. 3 shows a spectrum for the excitability of Sr Sion as a function of the excitation wavelength.

FIG. 3 shows a spectrum of the excitability of Sr Sion containing 10% of Eu as a function of the wavelength. The excitability is proportional to the product of absorbed energy and quantum efficiency. It can be seen that the Sr Sion according to the invention has an excitability of over 50% over a very wide wavelength range from 250 to 470 nm.

Figure 4:
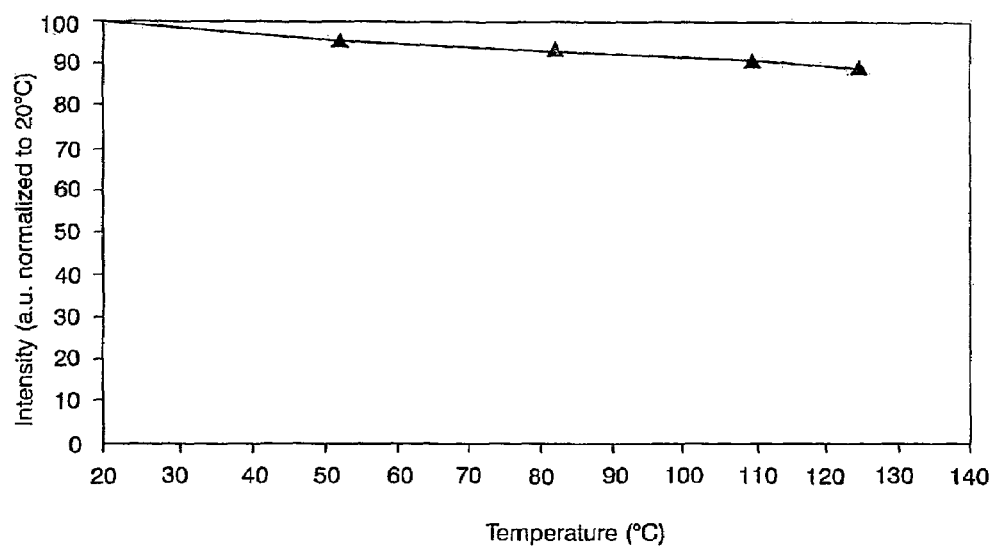
FIG. 4 shows the temperature profile of Sr Sion.
Figure 5A:
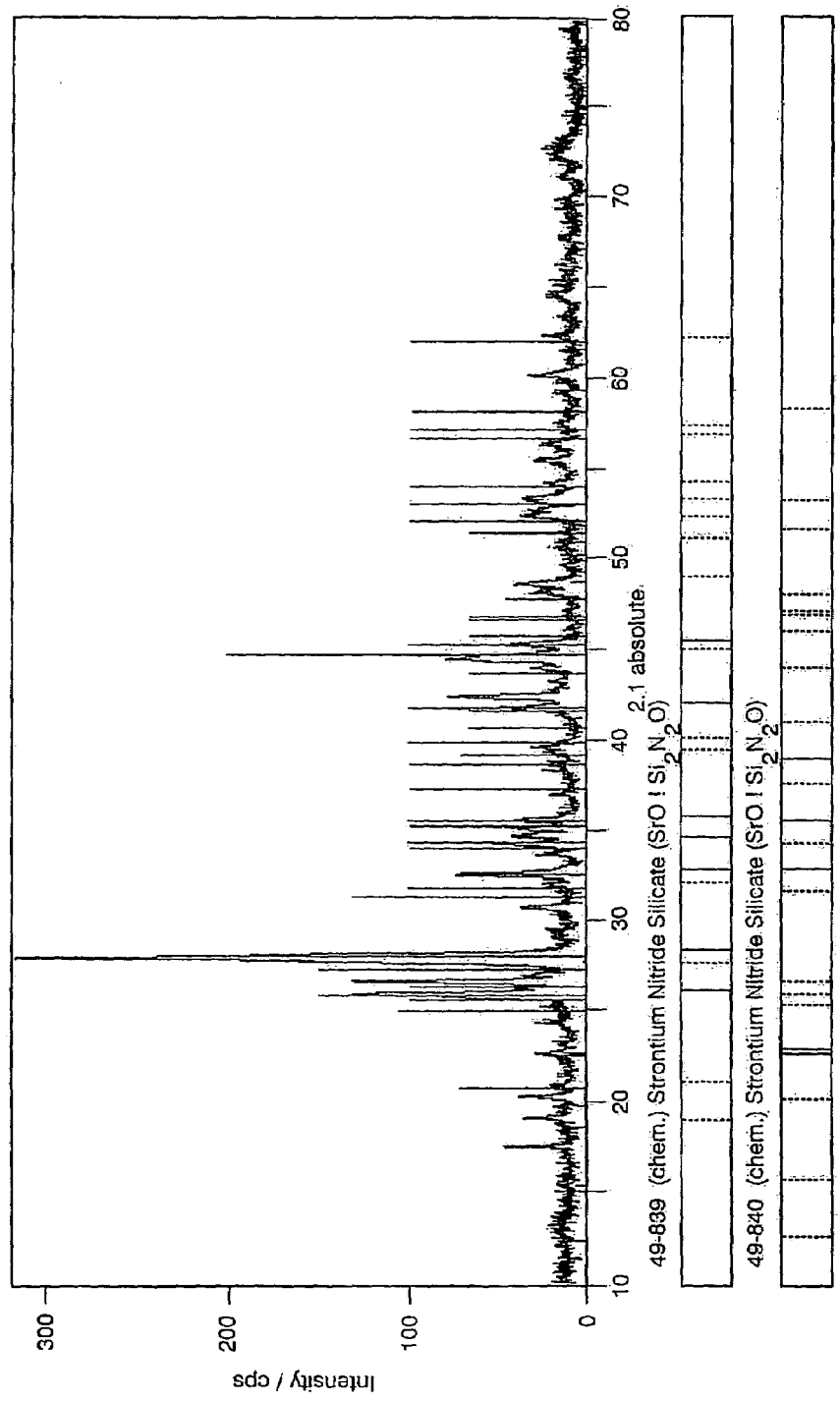
FIG. 5a shows an XRD spectrum for a strongly dominant LT modification.
Figure 5B:
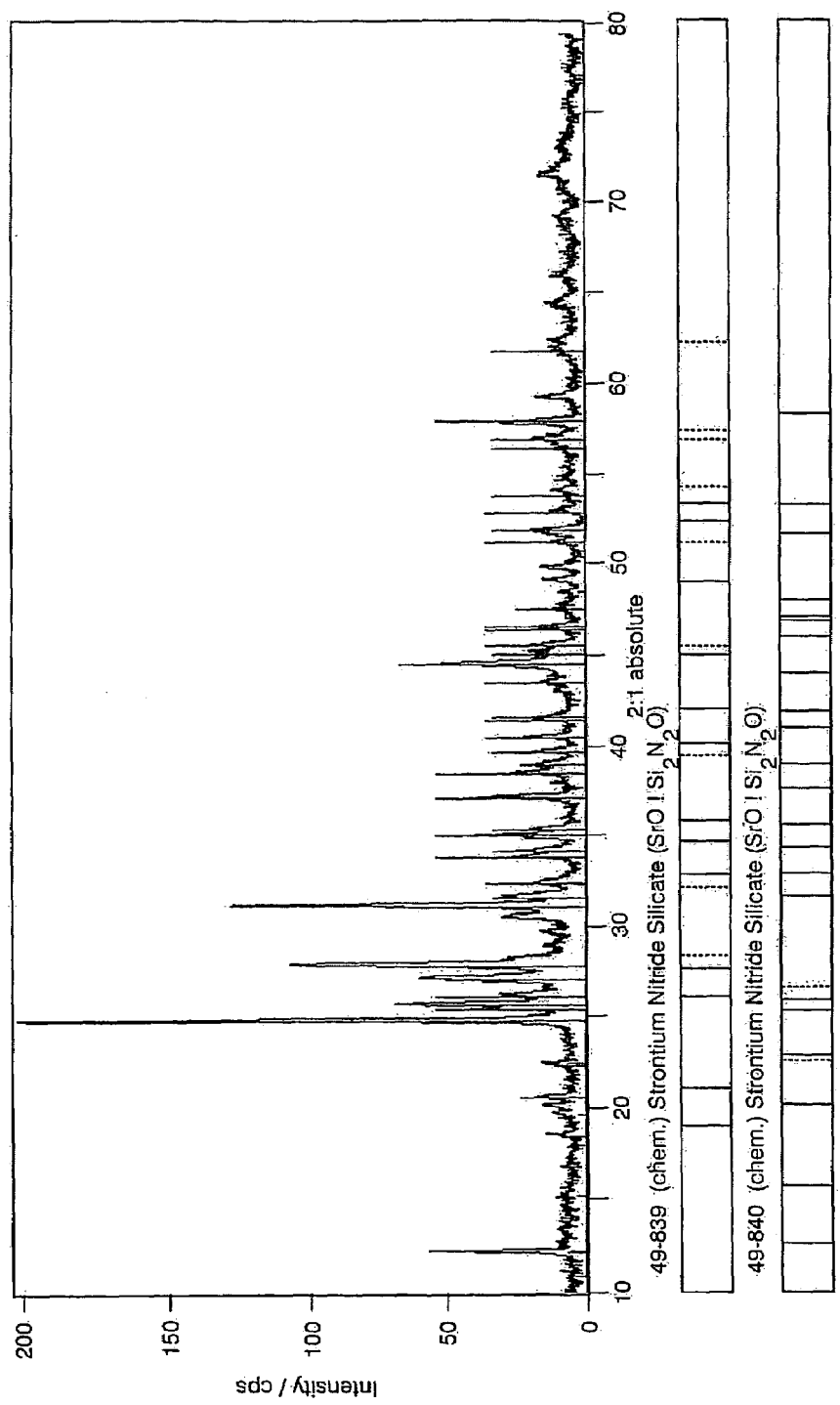
FIG. 5b shows an XRD spectrum for a mixture with an HT fraction of more than 50% R compared to the LT fraction.
Figure 5C:
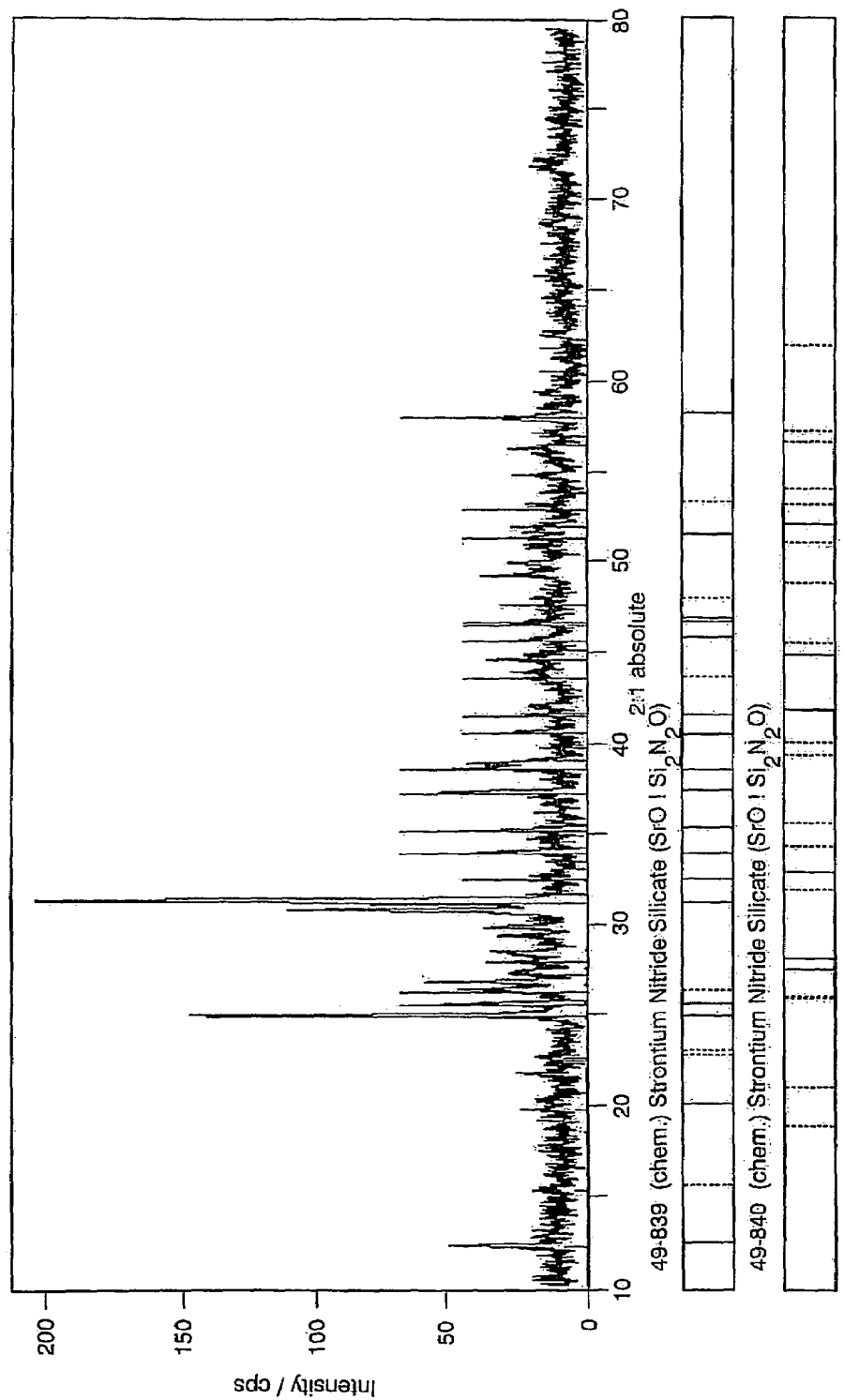
FIG. 5c shows a specimen in which the foreign phases have not been carefully excluded.
Figure 5D:
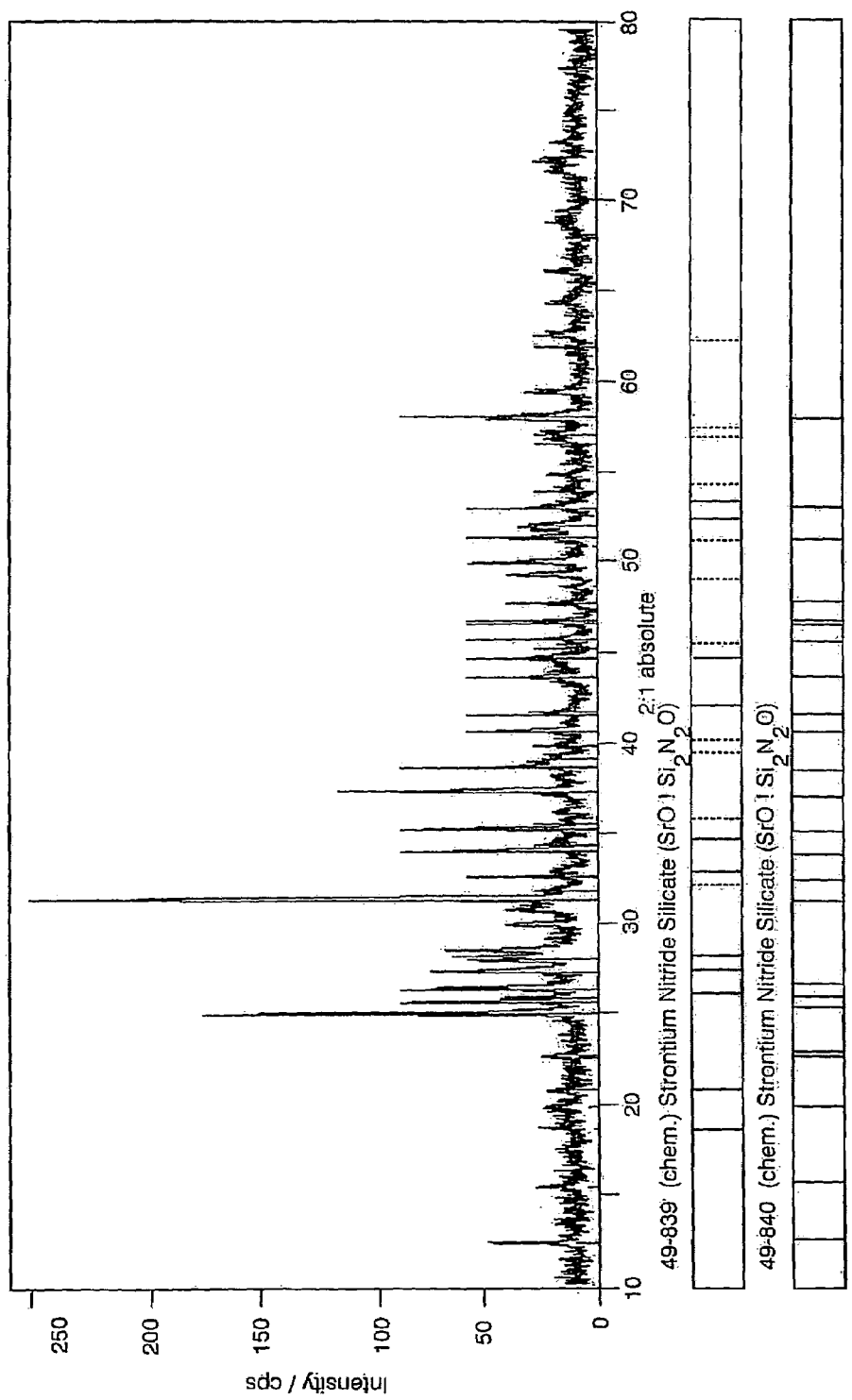
FIG. 5d shows an XRD spectrum for approximately pure HT.

FIG. 4 shows the temperature properties of this phosphor. The temperature quenching is amazingly low, amounting to at most 12% under a very high thermal loading of 125° C. compared to room temperature.

The different structure of differently produced phosphors is explained by FIG. 5, which plots XRD spectra, i.e. X-ray diffractograms, of four phosphors of the Sr Sion type. FIG. 5a shows an XRD spectrum for a strongly dominant LT modification. A characteristic feature is the strong peak at approximately 28.2°. This specimen achieves a quantum efficiency of approximately 10% of the HT modification and was produced using relatively unreactive starting material with annealing at approximately 1300° C. FIG. 5b shows an XRD spectrum for a mixture with an HT fraction of more than 50% compared to the LT fraction. In this case, the XRD reflections of the HT modification occur at approximately 31.7° and the triple reflex in the range from 25 to 27° is increasingly to the fore compared to the prominent LT reflex at 28.2°. The quantum efficiency compared to the HT modification is approximately 70%. Production was carried out at approximately 1400° C. FIG. 5c shows a specimen in which the foreign phases have not been carefully excluded. In particular the peak which can be assigned to the nitridosilicate at approximately 31.2°, which amounts to approximately 50% of the maximum peak height of the characteristic peak of the HT phase at 31.7°, is clearly apparent. Although the LT modification has been greatly suppressed here, this specimen reaches no more than 40% of the quantum efficiency of the pure HT modification. Finally, FIG. 5d shows an XRD spectrum for approximately pure HT, the quantum efficiency of which served as standard (100%) for the other specimens. Foreign phases and LT modification have been greatly suppressed here, by virtue of accurate stoichiometric production with annealing at approximately 1500° C. and a high purity and reactivity of the starting materials.

Figure 6:
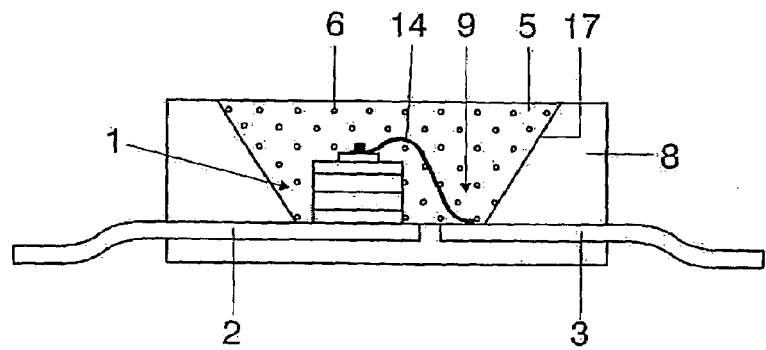
FIGS. 6 & 11 show a semiconductor component which serves as a light source for white light.

FIG. 6 specifically illustrates the structure of a light source for white light based on RGB. The light source is a semiconductor component having a chip 1 of type InGaN with a peak emission wavelength in the UV of, for example 405 nm, which is embedded in an opaque basic housing 8 in the region of a recess 9. The chip 1 is connected to a first terminal 3 via a bonding wire 14 and to a second electrical terminal 2 directly. The recess 9 is filled with a potting compound 5, which as its main constituents contains an epoxy casting resin (80 to 90% by weight) and phosphor pigments 6 (less than 20% by weight). A first phosphor is the green-emitting oxynitridosilicate proposed as the first exemplary embodiment, the second phosphor is a blue-emitting phosphor, in this case in particular BAM, and the third phosphor is a red-emitting nitridosilicate of the type (Ca,Sr)2Si5N8:Eu, in this case including the pure Sr and Ca variants as well as mixtures of Sr and Ca. The recess has a wall 17 which serves as reflector for the primary and secondary radiation from the chip 1 or the pigments 6.

Figure 9:
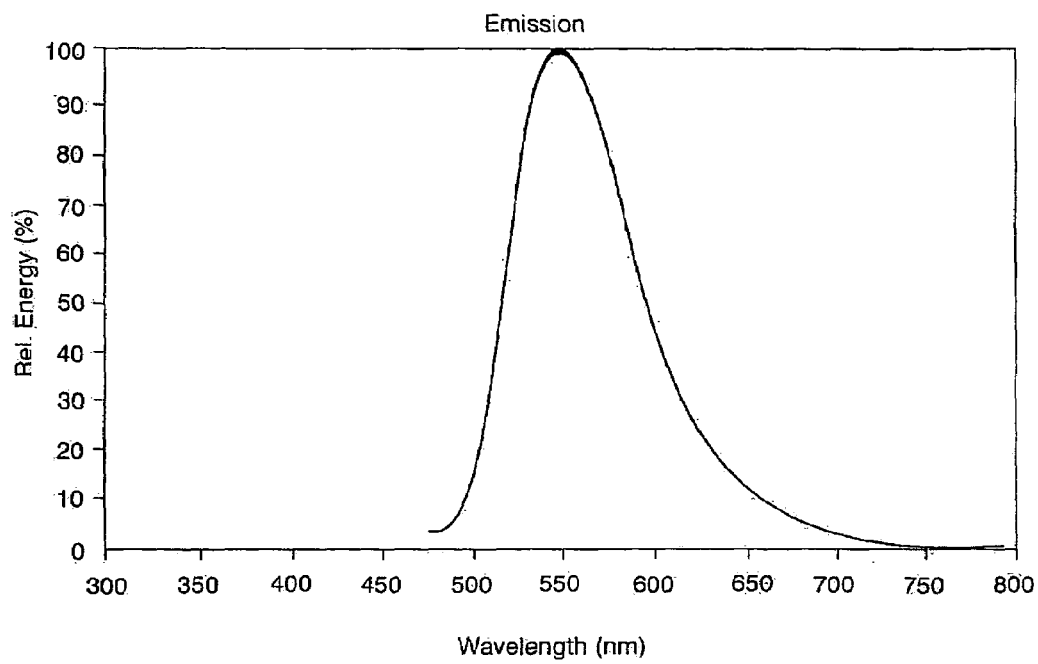

FIG. 9 shows an example of the emission for a mixed Sion $MSi_2O_2N_2$:Eu10% in which M=(10% Ca and remainder Sr). Excitation 460 nm; color locus x/y 0.397/0.576; dominant wavelength 564 nm FWHM=84 nm; quantum efficiency approx. 70%.

Figure 10:
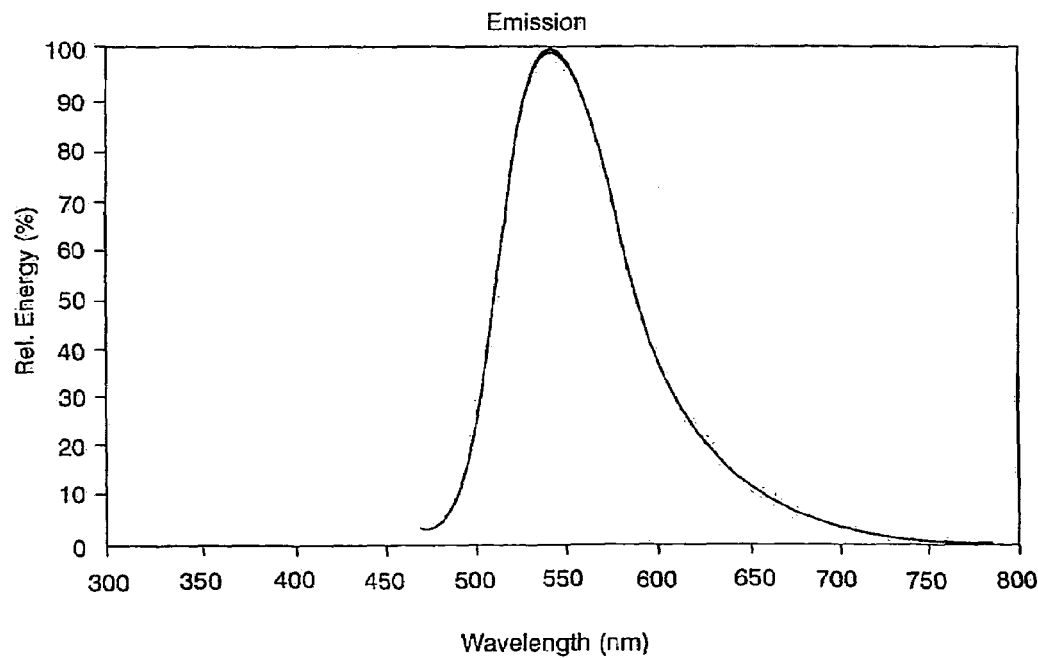

FIG. 10 shows an example of the emission for a mixed Sion $MSi_2O_2N_2$:Eu10% in which M=(10% Ba and remainder Sr). Excitation 460 nm; color locus x/y 0.411/0.566; dominant wavelength 566 nm FWHM=86 nm; quantum efficiency approx. 67%.

Figure 11:
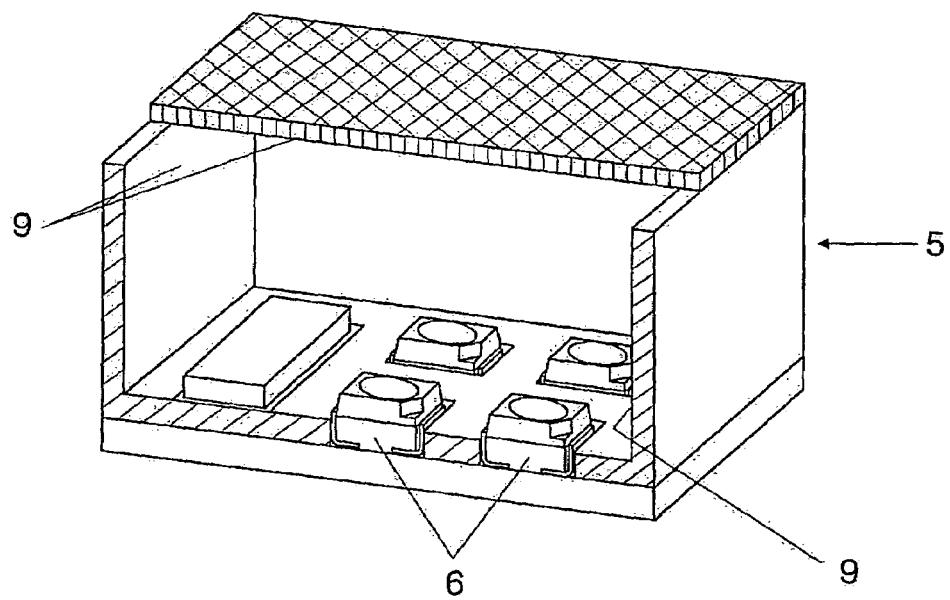
Figure 7:
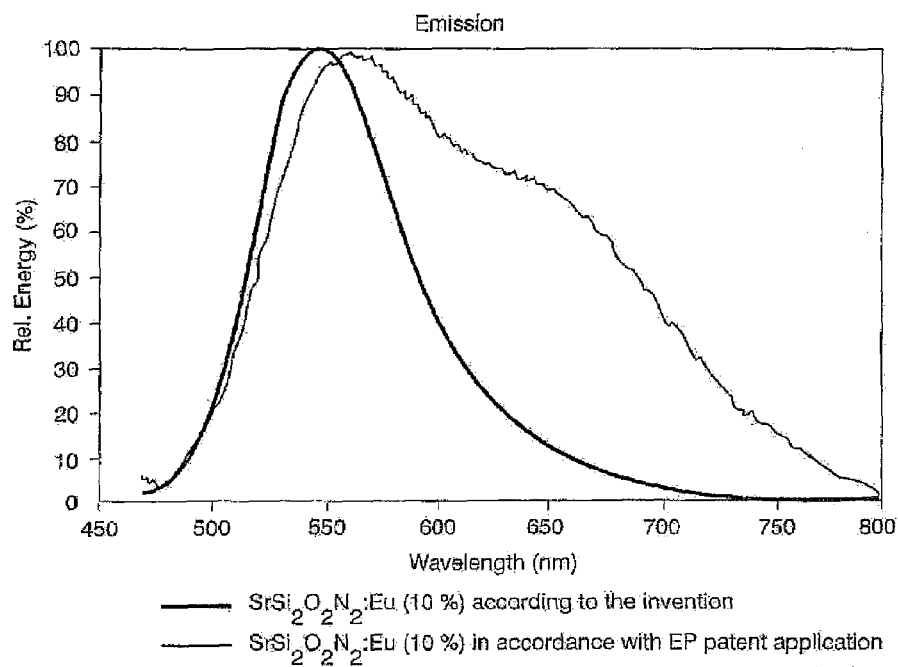
FIG. 7 shows an emission spectrum for two phosphors with and without foreign phases.

In a further exemplary embodiment shown in FIG. 11, the phosphor pigment used is once again a mixture of three such phosphors for an RGB mixture. However, these phosphors are applied to the walls 9 of an outer housing 5 which holds a plurality of LEDs 6 of the luminescence conversion LED type.

Amazingly, it has been found that a particularly efficient phosphor can be produced if it is strictly ensured that the starting materials, in particular $Si_3N_4$, contain very low levels of impurities. W, Co, Al and Ca are particularly critical impurities in this case.

It is possible for the SiN group in $MSi_2O_2N_2$ to be replaced by AlO groups on account of the fact that $Al^{3+}$ and $Si^{4+}$ have ion sizes and both groups have comparable bond lengths.

The invention claimed is:

1. A high-efficiency phosphor from the class of the oxynitridosilicates having a cation M and the empirical formula $M_{(1-c)}Si_2O_2N_2:D_c$, where M contains Sr as a constituent and where D is a divalent doping comprising Eu, wherein Sr alone or $Sr_{(1-x-y)}Ba_yCa_x$ with x+y<0.5 is used for M, the oxynitridosilicate completely or predominantly comprising the high-temperature-stable modification HT and wherein the Eu fraction of M constitutes between 0.1 and 20 mol % of M so that c=0.001 to 0.2, and wherein the level of W and Co impurities is less than 100 ppm with respect to precursor substances.

2. The phosphor as claimed in claim 1, wherein Sr represents the majority of M and a proportion of M is replaced by Ba and/or Ca.

3. The phosphor as claimed in claim 1, wherein M=(Sr,Ba) and a proportion of M is replaced by Ca and/or zinc.

4. The phosphor as claimed in claim 1, wherein M is partially substituted by Li or La.

5. The phosphor as claimed in claim 1, wherein part of the group SiN in the oxynitridosilicate of formula $MSi_2O_2N_2$, is replaced by the group AlO.

6. The phosphor as claimed in claim 1, wherein a proportion of Eu is replaced by Mn.

7. The phosphor as claimed in claim 1, wherein the level of W and Co impurities is less than 50 ppm, with respect to the precursor substances.

8. The phosphor as claimed in claim 1, wherein more than 70% of the oxynitridosilicate consists of the HT modification.

9. The phosphor as claimed in claim 1, wherein the oxynitridosilicate comprises the HT modification, and the proportion of foreign phases amounts to less than 15%.

10. The phosphor as claimed in claim 1, wherein the full width at half maximum (FWHM) of the emission from the phosphor under photon excitation which originates from a range with peak emission between 50 and 480 nm is less than 90 nm.

11. The phosphor as claimed in claim 1, wherein in its XRD spectrum, the level of foreign phases is minimized in accordance with the rule that with the XRD diffraction angle 2 Θ in the range from 25 to 32°, the intensity of all the foreign phase peaks is less than the intensity of the main peak characterizing the HT modification at approximately 31.8°.

12. The phosphor as claimed in claim 1, wherein in its XRD spectrum the proportion of the LT phase is minimized in accordance with the rule that the characterizing peak of the LT modification in the XRD spectrum at approximately 28.2° has an intensity of less than 1:1 compared to the peak with the highest intensity from the group of three reflections of the HT modification which lie in the XRD spectrum at 25 to 27°.

13. A light source having a primary radiation source which emits radiation in the short-wave region of the optical spectral region in the wavelength range from 50 to 480 nm, this radiation being completely or partially converted into secondary radiation of a longer wavelength, by means of at least a first phosphor as claimed in claim 1.

14. The light source as claimed in claim 13, wherein the primary radiation source used is a light-emitting diode based on InGaN.

15. The light source as claimed in claim 13, wherein some of the primary radiation is converted into radiation of a longer wavelength by means of a further, second phosphor, with the first phosphor and the second phosphor being selected and mixed in a suitable way to generate white light.

16. The light source as claimed in claim 15, wherein some of the primary radiation is converted into radiation of a longer wavelength by means of a third phosphor, this third phosphor emitting in the red spectral region.

17. A process for producing a high-efficiency phosphor from the class of the oxynitridosilicates having a cation M and the empirical formula $M_{(1-c)}Si_2O_2N_2:D_c$, where M contains Sr as a constituent and where D is a divalent doping comprising Eu, wherein Sr alone or $Sr_{(1-x-y)}Ba_yCa_x$ with x+y<0.5 is used for M, the oxynitridosilicate completely or predominantly comprising the high-temperature-stable modification HT and wherein an Eu fraction of M constitutes between 0.1 and 20 mol % of M so that c=0.001 to 0.2, and wherein the level of W and Co impurities is less than 100 ppm with respect to precursor substances, comprising the steps of:

a) providing the precursor substances $SiO_2$, $Si_3N_4$, remainder $MCO_3$, as well as an Eu precursor, in a substantially stoichiometric ratio and mixing the products; and b) annealing the mixture at approximately 1300 to 1600° C.

18. The process as claimed in claim 17, wherein the precursor substances have a high purity with respect to W and Co of less than 50 ppm.

19. The process as claimed in claim 17, wherein the precursor substances have a high reactivity of at least 6 m²/g BET surface area.

20. The process as claimed in claim 17, wherein the stoichiometric batch of all the components is accurately maintained to within at least 10%.

21. The phosphor as claimed in claim 6, wherein up to 30 mol % of Eu is replaced by Mn.

22. The phosphor as claimed in claim 5, wherein up to 30 mol % of the group SiN is replaced by the group AlO.

23. The light source as claimed in claim 16, wherein the third phosphor emitting in the red spectral region has a peak in the range from 580 to 670 nm.

24. The phosphor as claimed in claim 2, wherein up to 30 mol % of M is replaced by Ba and/or Ca.

25. The phosphor as claimed in claim 3, wherein up to 30 mol % of M is replaced by Ca and/or zinc.

26. The phosphor as claimed in claim 4, wherein M is partially substituted by Li or La up to 20 mol %.

\* \* \* \* \*